(12) United States Patent
Moriizumi

(10) Patent No.: US 7,613,254 B2
(45) Date of Patent: Nov. 3, 2009

(54) PHASE DETECTOR FOR COMPARING PHASES OF DATA AND A PLURALITY OF CLOCKS

(75) Inventor: Ryuichi Moriizumi, Mihama-ku (JP)

(73) Assignee: Kawasaki Microelectronics, Inc., Chiba (JP)

( * ) Notice: Subject to any disclaimer, the term of this patent is extended or adjusted under 35 U.S.C. 154(b) by 621 days.

(21) Appl. No.: 11/245,039

(22) Filed: Oct. 7, 2005

(65) Prior Publication Data

US 2006/0078078 A1    Apr. 13, 2006

(30) Foreign Application Priority Data

Oct. 7, 2004   (JP)   ............... 2004-294754

(51) Int. Cl.
  *H03D 3/22* (2006.01)
(52) U.S. Cl. .................. 375/332; 327/40; 327/41; 327/43; 327/158; 342/442; 375/373; 375/376
(58) Field of Classification Search ........... 375/332, 375/373
  See application file for complete search history.

(56) References Cited

U.S. PATENT DOCUMENTS 4,773,085 A * 9/1988 Cordell ................ 375/375
6,590,457 B2 * 7/2003 Schrodinger ............. 331/1 A
7,042,252 B2 * 5/2006 Galloway et al. ........... 327/16
7,340,655 B2 * 3/2008 Sugita ................... 714/700

OTHER PUBLICATIONS

Jonathan E. Rogers and John R. Long, "A 10-GB/S CDR/DEMUX with LC delay Line VCO in 0.18-0.18 μm CMOS", IEEE Journal of Solid-State circuits, vol. 37, No. 12, Dec. 2002.*

* cited by examiner

*Primary Examiner*—Shuwang Liu
*Assistant Examiner*—Dhaval Patel
(74) *Attorney, Agent, or Firm*—Oliff & Berridge, PLC

(57) ABSTRACT

A phase detector that compares the phases of data and four-phase first to fourth clocks having a half rate of the data and being 90° out of phase with one another. Exemplary embodiments of the phase detector include first to fourth sampling circuits that sample the data by the four-phase first to fourth clocks; a first comparator that compares sampling data obtained by sampling according to the adjacent two-phase first and second clocks using the first and second sampling circuits, respectively, and when the sampling data is different, outputs a first up signal; and a second comparator that compares sampling data obtained by sampling according to the adjacent two-phase fourth and first clocks using the fourth and first sampling circuits, respectively, and when the sampling data is different, outputs a first down signal.

4 Claims, 5 Drawing Sheets

Related Art

Related Art

PHASE DETECTOR FOR COMPARING PHASES OF DATA AND A PLURALITY OF CLOCKS

BACKGROUND

The present invention relates to a phase detector that compares the phases of data and clocks and outputs the result of comparison.

Two types of phase detectors are general phase detectors used for a phase-locked loop (PLL) and a clock-data recovery (CDR) circuit. The first type of general phase detector is a Hogge phase detector. See C. R. Hogge, "A Self Correcting Clock Recovery Circuit", J. Lightwave Technol., vol. LT-3, pp. 1312-1314, December, 1985. The second type of general phase detector is an Alexander phase detector, also called a bang-bang phase detector. See J. D. H. Alexander, "Clock Recovery from Random Binary Signals", Electron Lett., vol. 11, no. 22, pp. 541-542, October, 1975. The Hogge phase detector outputs the linear result of a comparison of the phases between data and clocks, based on a difference between the phases of the data and the phases of the clocks. The Alexander phase detector detects only whether the phases of clocks are earlier or later than the phases of data and outputs the binary result.

SUMMARY

The loop that includes a binary-output phase detector can be assumed to be a quasi digital circuit, thus offering the advantages that the structures can be combined more easily and having a higher tolerance to process variations and noise than the linear-output phase detectors. The binary-output phase detector also has the characteristic of adjusting delay time more easily than the linear-output phase detector. Various exemplary embodiments of a binary-output phase detector will now be described using the Alexander phase detector as an example.

FIG. 4 is a circuit diagram of an exemplary embodiment of an Alexander phase detector that compares the phases of clocks and data using three kinds of data obtained by 3× oversampling of data by clock pulses. To the comparator in FIG. 4, data A, B, and C that is sampled at the rising edge of clocks CA, CB, and CC as shown in FIG. 5 is inputted. An exemplary phase detector as shown in FIG. 4 outputs the comparison results, an up signal Up and a down signal Down.

Referring to FIG. 5, and assuming that the clocks CA and CC are clocks that sample the center of the data Data at the rising edge, the clock CB is a clock that samples the transition part of the data Data at the rising edge.

Table 1 is a truth table that shows an exemplary operation of the exemplary comparator in FIG. 4. Symbols, A, B, and C in Table 1 indicate exemplary sampling data input to the exemplary comparator. The symbol X indicates a value "1" or "0" as opposed to a variable value. The symbol Up in the output column indicates that the comparator outputs "1" as an up signal Up and "0" as a down signal Down. Similarly, a symbol Down in the output column indicates that the comparator outputs "1" as a down signal Down and "0" as an up signal Up. An exemplary symbol Tri-State in the output column indicates that the comparator outputs "0"s as an up signal Up and as a down signal Down.

TABLE 1

| A | B | C | Output |
|---|---|---|--------|
| 0 | 0 | 1 | Down |
| 0 | 1 | 1 | Up |
| 0 | X | 0 | Tri-State |
| 1 | 1 | 0 | Down |
| 1 | 0 | 0 | Up |
| 1 | X | 1 | Tri-State |

As shown in Table 1, the exemplary sampling data (B) obtained by sampling the transition part of the exemplary data Data at the rising edge (CB) of the clock CB and the exemplary sampling data (A) obtained by sampling the center of the previous data Data at the rising edge (CA) of the clock CA are different (B≠A). The difference in exemplary data A and B indicates that the clocks CA, CB, and CC are later than the data Data. Accordingly, the exemplary comparator outputs "1" as an up signal Up (and "0" as a down signal Down).

In a different example, the exemplary sampling data (B) obtained by sampling the transition part of the data Data at the rising edge (CB) of the clock CB and the exemplary sampling data (C) obtained by sampling the center of the latest data Data at the rising edge (CC) of the clock CC are different (B≠C). The difference in exemplary data B and C indicates that the clocks CA, CB, and CC are earlier than the exemplary data Data. Accordingly, the exemplary comparator outputs "1" as a down signal Down (and "0" as an up signal Up).

When the exemplary data Data does not transit (A=C=0, or A=C=1), the exemplary comparator outputs "0" as an exemplary up signal Up and an exemplary down signal Down. In other words, the exemplary comparator shifts to the Tri-State.

FIG. 6 is an exemplary circuit diagram of an exemplary embodiment of an Alexander phase detector that compares the phases of clocks and data using four kinds of sampling data obtained by 4× oversampling of data by four-phase half-rate clock pulses on the basis of the concept described above. See J. E. Rogers, "A 10·Gb/s CDR/DEMUX With LC Delay Line VCO in 0.18 µm CMOS", IEEE J. Solid-State Circuits, vol. 37, pp. 1781-1789, December, 2002. The exemplary embodiment of an Alexander phase detector shown in FIG. 6 has a logic circuit for sampling the exemplary data Data at the rising edge of exemplary four-phase clocks CI, CQ, CIb, and CQb, respectively. This exemplary detector synchronizes the sampling data by the clock CI, then compares the sampling data, and outputs an up signal Up and a down signal Down, synchronized by the clock CI.

As shown in FIG. 7, the exemplary clocks CI, CQ, CIb, and CQb are four-phase clocks having the half rate of the exemplary data Data and each phase difference of the four-phase clocks is 90°. The clocks CI and CIb are exemplary clocks that sample the center of the exemplary data Data at its rising edge. The Clocks CQ and CQb are clocks that sample the transition part of the exemplary data Data at its rising edge.

The logic circuit of the exemplary embodiment of an Alexander phase detector shown in FIG. 6 compares the exemplary sampling data obtained by sampling the transition part of the exemplary data Data at the rising edge (CQ and CQb) of the clocks CQ and CQb and the sampling data obtained by sampling the center of the exemplary data Data at the rising edge (CI and CIb) of the exemplary clocks CI and CIb. This exemplary embodiment uses a flip-flop or a latch for synchronizing the sampling data obtained by sampling at different timings. However, this exemplary embodiment causes the disadvantages of an extra logic circuit, circuit area, and power consumption. An increasing latency in the PLL due to the logic circuit causes difficulty for stability of the PLL and typically results in a reduced loop gain.

Accordingly, it is an object of various exemplary embodiments to provide a phase detector in which the problems described above are solved.

In various exemplary embodiments, the scale of the logic circuit for comparison operation is reduced, so that the circuit area, the delay time, and the power consumption are reduced.

In order to achieve the above objects, according to an aspect of various exemplary embodiments, there is provided a phase detector that compares the phases of data and four-phase first, second, third, and fourth clocks having a half rate of the data and a 90° phase difference with one another. In various exemplary embodiments, the phase detector includes first, second, third, and fourth sampling circuits that sample the data according to the four-phase first, second, third, and fourth clocks; a first comparator that compares sampling data obtained by sampling according to the adjacent two-phase first and second clocks using the first and second sampling circuits, respectively, to each other, and when that sampling data is different from each other, outputs a first up signal; and a second comparator that compares sampling data obtained by sampling according to the adjacent two-phase fourth and first clocks using the fourth and first sampling circuits, respectively, to each other, and when the sampling data is different from each other, outputs a first down signal.

Various exemplary embodiments further include a third comparator that compares sampling data obtained by sampling according to the adjacent two-phase second and third clocks using the second and third sampling circuits, respectively, to each other, and when the sampling data is different from each other, outputs a second down signal; and a fourth comparator that compares sampling data obtained by sampling according to the adjacent two-phase third and fourth clocks using the third and fourth sampling circuits, respectively, to each other, and when the sampling data is different from each other, outputs a second up signal.

The phase detector according to various exemplary embodiments compares only the sampling data obtained by sampling according to adjacent two-phase clocks. The phase detector according to various exemplary embodiments can synchronize signals with two-phase clocks, thus processing the data in parallel by the two-phase clocks. Thus, the phase detector according to various exemplary embodiments can greatly reduce the scale of the logic circuit for the data comparison operation as compared with other phase detectors. Accordingly, the phase detector according to various exemplary embodiments is reduced in circuit area, delay time, and power consumption as compared with other phase detectors. The reduction of latency owing to the extra logic circuit improves the stability of PLL circuits and CDR circuits.

DETAILED DESCRIPTION

A phase detector according to various exemplary embodiments will be described in detail with reference to the accompanying drawings.

Figure 1:
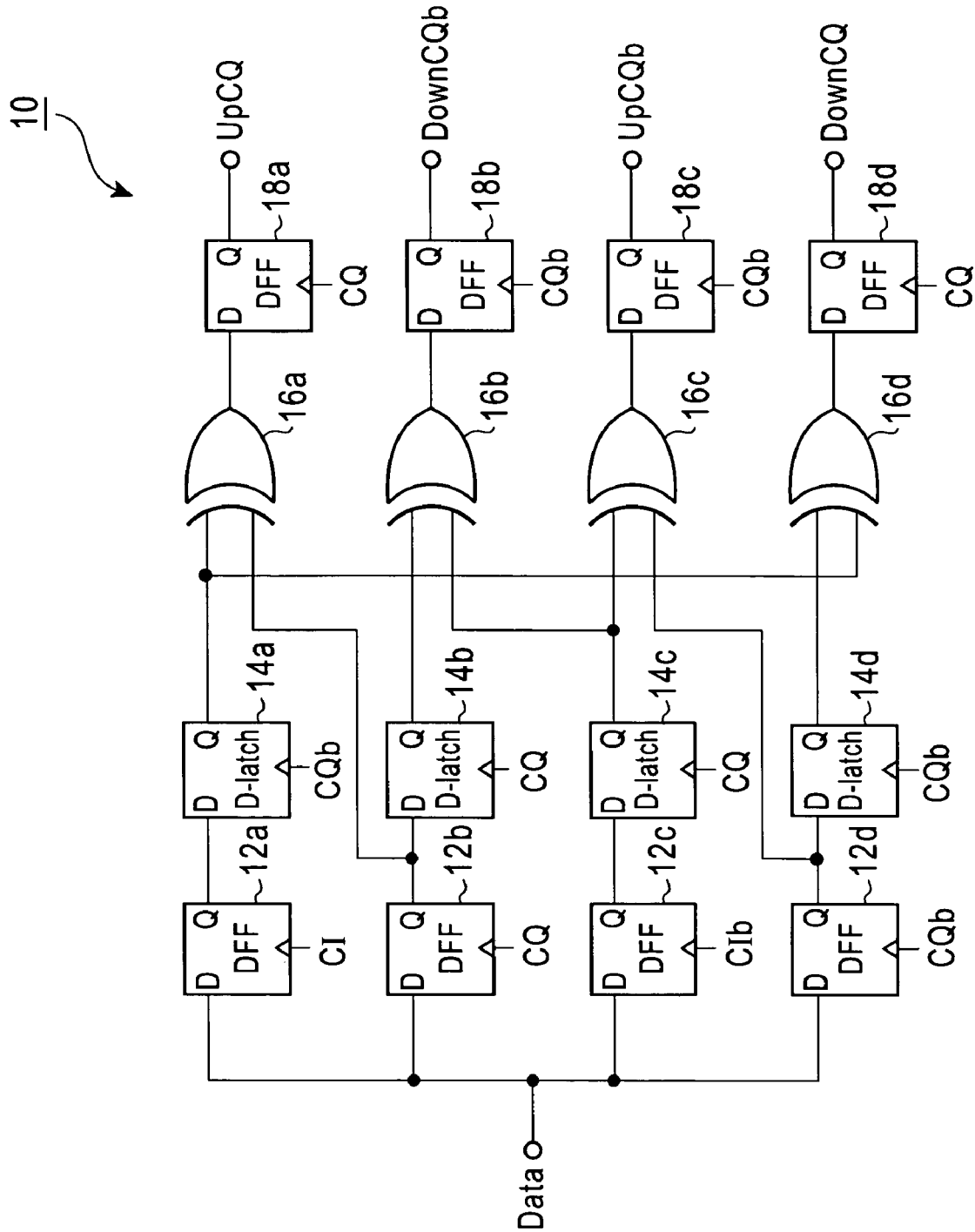
FIG. 1 is a circuit diagram of an exemplary embodiment of a phase detector.

FIG. 1 is an exemplary circuit diagram of an exemplary embodiment of a phase detector 10. The exemplary phase detector 10 in this drawing compares the phases of exemplary data Data and exemplary four-phase clocks CI, CQ, CIb, and CQb and outputs, as its comparison results, an up signal UpCQ and a down signal DownCQ that are synchronized with the rising edge of the clock CQ, and an up signal UpCQb and a down signal DownCQb that are synchronized with the rising edge of the clock CQb.

Figure 7:
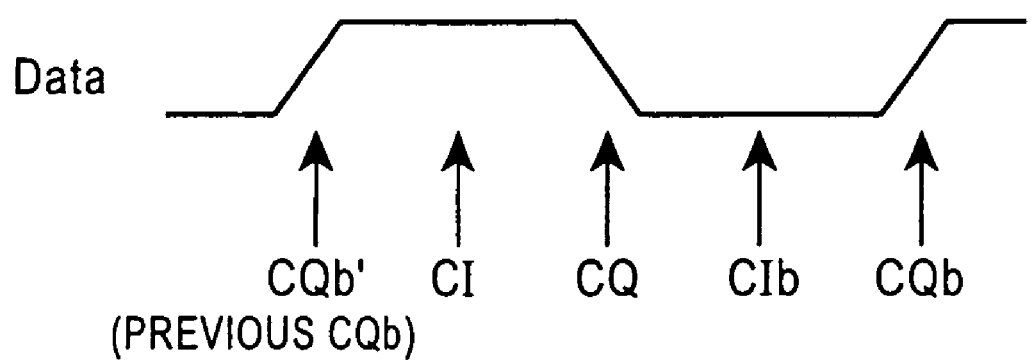
FIG. 7 is an exemplary schematic diagram of an exemplary relationship between data and four-phase clocks in an exemplary phase detector, in the case of 4× oversampling data.

Exemplary four-phase clocks CI, CQ, CIb, and CQb will be described with reference to FIG. 7. They have a half rate of the exemplary data Data and have a 90° phase difference with one another. In various exemplary embodiments, the clocks CI and CIb are clocks that sample the center of the data Data at its rising edge. The clocks CQ and CQb are clocks that sample the transition part of the data Data at its rising edge.

Referring to FIG. 1, the exemplary phase detector 10 includes four flip-flops 12a, 12b, 12c, and 12d serving as sampling circuits for the exemplary data Data; four latches 14a, 14b, 14c, and 14d serving as timing-adjusting circuits for comparison operation; four EXOR circuits 16a, 16b, 16c, and 16d serving as comparators; and four flip-flops 18a, 18b, 18c, and 18d serving as timing-adjusting circuits in an output stage.

In various exemplary embodiments, flip-flops 12a, 12b, 12c, and 12d sample the exemplary data Data at the rising edge of the exemplary clocks CI, CQ, CIb, and CQb, respectively. To the respective data-input terminals D of the exemplary flip-flops 12a, 12b, 12c, and 12d, the exemplary data Data is inputted; to the clock-input terminals, the exemplary clocks CI, CQ, CIb, and CQb are inputted, respectively.

In various exemplary embodiments, the exemplary latches 14a and 14d allow the output signals from the flip-flops 12a and 12d to pass through at a low level of the clock CQb, and hold them at a high level, thus adjusting the output timing. In various exemplary embodiments, to the data input terminals D of the latches 14a and 14d, the output signals from the flip-flops 12a and 12d are inputted, respectively. In various exemplary embodiments, to the clock input terminals, the clock CQb is inputted.

In various exemplary embodiments, the latches 14b and 14c allow the output signals from the flip-flops 12b and 12c to pass through at a low level of the clock CQ, and hold them at a high level, thus adjusting the output timing. In various exemplary embodiments, to the data input terminals D of the latches 14b and 14c, the output signals from the flip-flops 12b and 12c are inputted, respectively. In various exemplary embodiments, to the clock input terminals, the clock CQ is inputted.

In various exemplary embodiments, subsequently, the EXOR circuit 16a compares the data that is sampled by the flip-flop 12a and then adjusted in timing by the latch 14a to the data sampled by the flip-flop 12b, and outputs the comparison result. In various exemplary embodiments, to the EXOR circuit 16a, the output signal from the latch 14a and the output signal from the flip-flop 12b are input.

Similarly, in various exemplary embodiments, the EXOR circuit 16b compares the data that is sampled by the flip-flop 12b and then adjusted in timing by the latch 14b to the data that is sampled by the flip-flop 12c and then adjusted in timing by the latch 14c, and outputs the comparison result. In various exemplary embodiments, to the EXOR circuit 16b, the output signals from the latches 14b and 14c are input.

In various exemplary embodiments, the EXOR circuit 16c compares the data that is sampled by the flip-flop 12c and then adjusted in timing by the latch 14c to the data that is sampled by the flip-flop 12d, and outputs the comparison result. In various exemplary embodiments, to the EXOR circuit 16c, the output signal from the latch 14c and the output signal from the flip-flop 12d are input.

In various exemplary embodiments, the EXOR circuit 16d compares the data that is sampled by the flip-flop 12d and then adjusted in timing by the latch 14d to the data that is sampled by the flip-flop 12a and then adjusted in timing by the latch 14a, and outputs the comparison result. In various exemplary embodiments, to the EXOR circuit 16d, the output signals from the latches 14a and 14d are input.

In various exemplary embodiments, the EXOR circuits 16a, 16b, 16c, and 16d output the signals at a high level when the data is different from one another as a comparison result, and output the signals at a low level when the data is the same.

Finally, in various exemplary embodiments, the flip-flops 18a and 18d hold the output signals from the EXOR circuits 16a and 16d, respectively, at the rising edge of the clock CQ, and output them. In various exemplary embodiments, to the data input terminals D of the flip-flops 18a and 18d, the output signals from the EXOR circuits 16a and 16d are input, respectively. In various exemplary embodiments, to the clock input terminals, the clock CQ is input. In various exemplary embodiments, from the flip-flops 18a and 18d, an up signal UpCQ and a down signal DownCQ are output, respectively.

In various exemplary embodiments, the flip-flops 18b and 18c hold the output signals from the EXOR circuits 16b and 16c, respectively, at the rising edge of the clock CQb, and output them. In various exemplary embodiments, to the data input terminals D of the flip-flops 18b and 18c, the output signals from the EXOR circuits 16b and 16c are input, respectively. In various exemplary embodiments, to the clock input terminals, the clock CQb is input. In various exemplary embodiments, from the flip-flops 18b and 18c, a down signal DownCQb and an up signal UpCQb are output, respectively.

In various exemplary embodiments, the up signal UpCQ and the down signal DownCQ are output in synchronization with the rising edge of the clock CQ in the output stage of the phase detector 10. In various exemplary embodiments, the up signal UpCQb and the down signal DownCQb are output in synchronization with the rising edge of the clock CQb. In other words, in various exemplary embodiments, the signals are output alternately with the timing shifting from each other by the time corresponding to a unit interval of exemplary data Data.

The operation of the exemplary phase detector 10 shown in FIG. 1 will now be described with reference to Table 2. Table 2 is a truth table that shows the operation of the exemplary phase detector 10 when the data Data is 4× oversampled at the rising edge of the exemplary four-phase clocks CI, CQ, CIb, and CQb, as shown in FIG. 7. The symbols, I, Q, Ib, and Qb (Qb') in Table 2 indicate sampling data when the exemplary data Data is sampled at the rising edge of the exemplary four-phase clocks CI, CQ, CIb, and CQb (CQb' (previous CQb)), respectively. The symbols UpCQ, UpCQb, DownCQ, and DownCQb indicate the state of the exemplary up signals UpCQ and exemplary UpCQb and the exemplary down signals DownCQ and DownCQ output from the phase detector 10, respectively.

TABLE 2

| Comparison | UpCQ | DownCQ | UpCQb | DownCQb |
|---|---|---|---|---|
| I ≠ Qb' | 0 | 1 | 0 | 0 |
| I ≠ Q | 1 | 0 | 0 | 0 |
| Ib ≠ Q | 0 | 0 | 0 | 1 |
| Ib ≠ Qb | 0 | 0 | 1 | 0 |
| The others | 0 | 0 | 0 | 0 |

As shown in Table 2, when the data (I) obtained by sampling the exemplary data Data at the rising edge (CI) of the exemplary clock CI and the data (Qb) obtained by sampling the previous data Data at the rising edge (CQb) of the exemplary clock CQb' are different (I≠Qb'), it indicates that the clocks CQb' and CI are earlier than the data Data. Accordingly, in various exemplary embodiments, the exemplary phase detector 10 outputs "1" as the down signal DownCQ, and "0" as the other signals.

In various exemplary embodiments, when the data (I) obtained by sampling the exemplary data Data at the rising edge (CI) of the exemplary clock CI and the exemplary data (Q) obtained by sampling the next data Data at the rising edge (CQ) of the exemplary clock CQ are different (I≠Q), it indicates that the clocks CI and CQ are later than the data Data. Accordingly, in various exemplary embodiments, the exemplary phase detector 10 outputs "1" as the up signal UpCQ, and "0" as the other signals.

In various exemplary embodiments, when exemplary data (Ib) obtained by sampling the exemplary data Data at the rising exemplary edge (CIb) of the exemplary clock CIb and the exemplary data (Q) obtained by sampling the previous data Data at the rising edge (CQ) of the exemplary clock CQ are different (Ib≠Q), it indicates that the clocks CQ and CIb are earlier than the data Data. Accordingly, in various exemplary embodiments, the exemplary phase detector 10 outputs "1" as the down signal DownCQb, and "0" as the other signals.

In various exemplary embodiments, when the exemplary data (Ib) obtained by sampling the exemplary data Data at the rising edge (CIb) of the exemplary clock CIb and the exemplary data (Qb) obtained by sampling the next data Data at the rising edge (CQb) of the exemplary clock CQb are different (Ib≠Qb), it indicates that the clocks CIb and CQb are later than the data Data. Accordingly, in various exemplary embodiments, the exemplary phase detector 10 outputs "1" as the up signal UpCQb, and "0" as the other signals.

In various exemplary embodiments, when no transition exists in the exemplary data Data (in the case of "the others" in Table 2), the exemplary phase detector 10 outputs "0" as the up signal UpCQ and the down signal DownCQ, the up signal UpCQb, and the down signal DownCQb.

An exemplary embodiment of an operation of the exemplary phase detector 10 when the four-phase clocks CI, CQ, CIb, and CQb are later than the data Data will be described.

Figure 2:
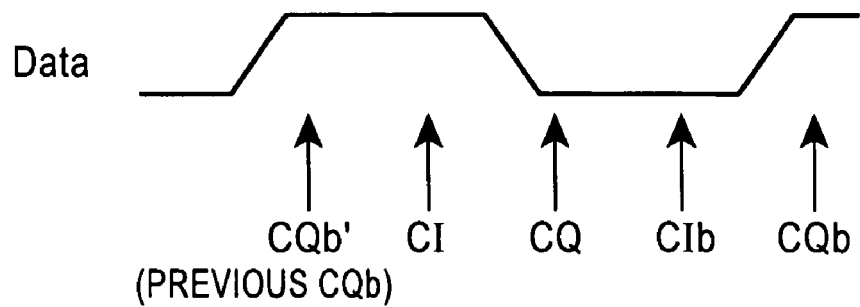
FIG. 2 is a schematic diagram of an exemplary relationship between exemplary data and exemplary four-phase clocks when the clocks are later than the data.

When the exemplary four-phase clocks CI, CQ, CIb, and CQb are later than the exemplary data Data, as the relationship between the data Data and the four-phase clocks CI, CQ, CIb, and CQb is shown in FIG. 2, transition of the data Data results in I≠Q and Ib≠Qb.

Figure 3:
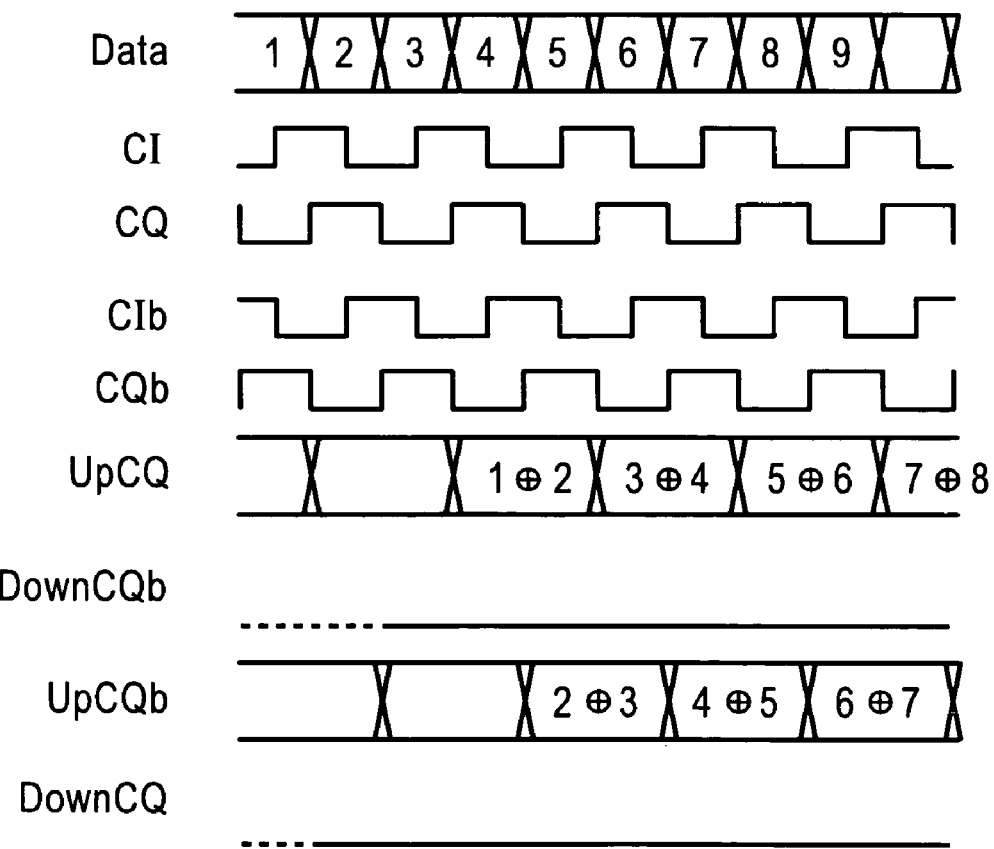
FIG. 3 is an exemplary timing chart of the operation of the exemplary embodiment of a phase detector shown in FIG. 1 when the relationship between the exemplary data and the exemplary clocks is in the condition of FIG. 2.
Figure 4:
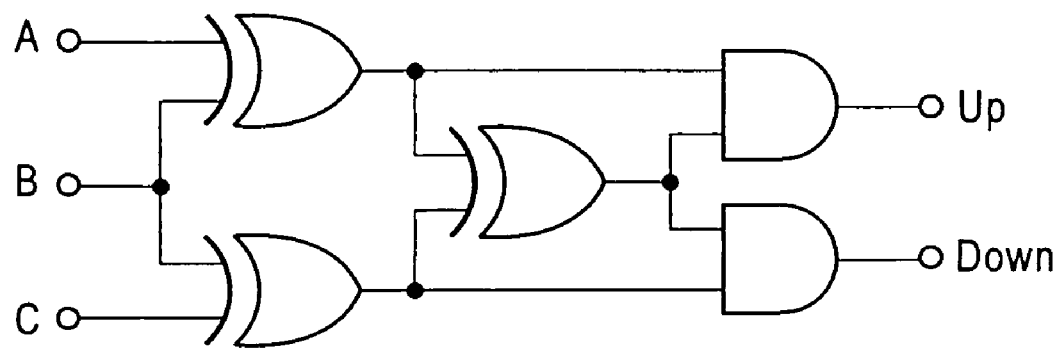
FIG. 4 is an exemplary circuit diagram of an exemplary embodiment of a comparator of an Alexander phase detector that compares the phases of clocks and data using three kinds of sampling data obtained by 3× oversampling of data by clock pulses.
Figure 5:
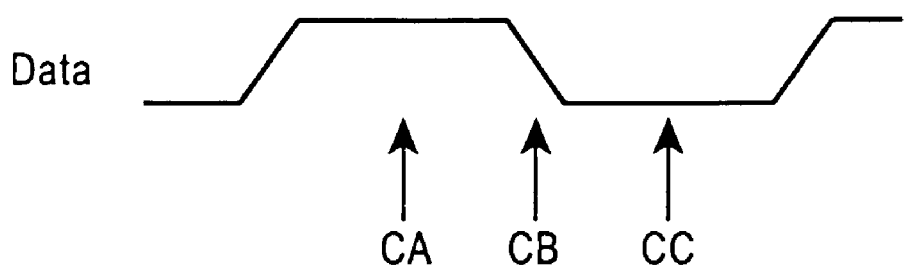
FIG. 5 is an exemplary schematic diagram of an exemplary relationship between data and clocks in an exemplary phase detector including the exemplary embodiment of a comparator shown in FIG. 4.

Accordingly, in that exemplary embodiment, as shown in the timing chart of FIG. 3, when transition exists in the exemplary data Data, the exemplary up signal UpCQ output from the exemplary phase detector 10 rises to a high level at the rising edge of the clock CQ as a result of the comparison by the exemplary EXOR circuit 16a. In various exemplary embodiments, when no transition exists in the exemplary data Data, the signal UpCQ falls to a low level. Similarly, when transition exists in the exemplary data Data, the up signal UpCQb rises to a high level at the rising edge of the clock CQb as a result of the comparison by the EXOR circuit 16c. In various exemplary embodiments, when no transition exists in the exemplary data Data, the up signal UpCQ falls to a low level.

In various exemplary embodiments, when the exemplary four-phase clocks CI, CQ, CIb, and CQb are later than the exemplary data Data, relations I=Qb' and Ib=Q hold irrespective of the transition of the data Data. Accordingly, in the embodiment shown in the timing chart of FIG. 3 similarly, the exemplary down signal DownCQ and the exemplary down signal DownCQb output from the exemplary phase detector 10 stay at a low level at all times as a result of the comparison by the EXOR circuits 16d and 16b, respectively.

Figure 6:
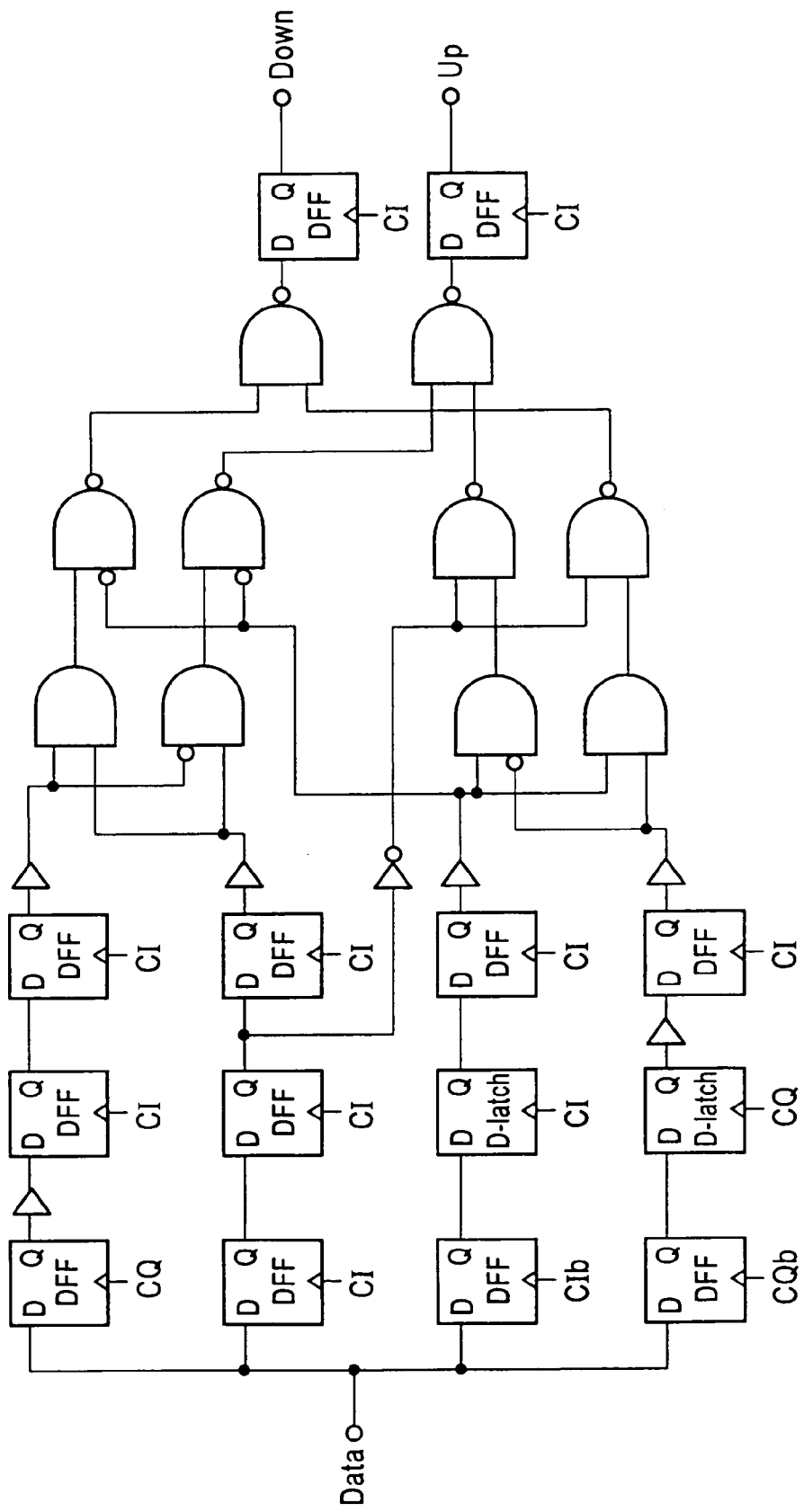
FIG. 6 is an exemplary circuit diagram of an exemplary embodiment of an Alexander phase detector that compares the phases of clocks and data using four kinds of sampling data obtained by 4× oversampling data by four-phase half-rate clock pulses.

As has been described, in various exemplary embodiments, the exemplary phase detector 10 compares only the data (Qb' and I, I and Q, Q and Ib, and Ib and Qb) sampled by adjacent two-phase clocks (CQb' and CI, CI and CQ, CQ and CIb, and CIb and CQb). In various exemplary embodiments, the phase detector 10 does not synchronize signals with a single clock (the clock CI for the exemplary phase detector shown in FIG. 6), but with two-phase clocks (CQ and CQb in FIG. 1), thus processing the data in parallel by the two-phase clocks.

Thus, in various exemplary embodiments, the phase detector 10 facilitates logical operation as compared with other phase detectors, and decreases the number of circuits required for synchronization, thus greatly reducing the scale of the logic circuit for data comparison operation. Accordingly, the exemplary phase detector 10 is reduced in circuit area, latency, and power consumption as compared with other phase detectors. In various exemplary embodiments, the reduction of latency owing to the logic circuit improves the stability of PLL circuits and CDR circuits.

While the exemplary embodiment of phase detector 10 shown in FIG. 1 outputs the up signal UpCQ and the down signal DownCQ, and the up signal UpCQb and the down signal DownCQb, it should be apparent that variations exist in other exemplary embodiments. For example, in various exemplary embodiments, the phase detector 10 outputs only the up signal UpCQ and the down signal DownCQ. In other exemplary embodiments, the phase detector 10 outputs only the up signal UpCQb and the down signal DownCQb. In those exemplary embodiments, the frequency of the output of the up signal and the down signal becomes one-half. Thus, in various exemplary embodiments, the scale of the circuit is further reduced.

While various exemplary embodiments of a phase detector have been described in detail, it should be apparent that the invention is not limited to the exemplary embodiments described herein, but various modifications and variations exist in other embodiments without departing from the spirit and scope of the invention.

What is claimed is:

1. A phase detector that compares the phases of data and four-phase first, second, third, and fourth clocks having a half rate of the data and being out of phase with one another by a specified value, the phase detector comprising:
   first, second, third, and fourth sampling circuits that sample the data according to the four-phase first, second, third, and fourth clocks;
   a first comparator that compares first and second sampling data obtained by sampling according to the adjacent two-phase first and second clocks using the first and second sampling circuits, respectively, to each other, and when the first and second sampling data are different from each other, outputs a first up signal;
   a second comparator that compares fourth sampling data and the first sampling data obtained by sampling according to the adjacent two-phase fourth and first clocks using the fourth and first sampling circuits, respectively, to each other, and when the fourth and first sampling data are different from each other, outputs a first down signal;
   a third comparator that compares the second sampling data with a third sampling data obtained by sampling according to the adjacent two-phase second and third clocks using the second and third sampling circuits, respectively, and when the second and third sampling data are different from each other, outputs a second down signal; and
   a fourth comparator that compares the third sampling data with a fourth sampling data obtained by sampling according to the adjacent two-phase third and fourth clocks using the third and fourth sampling circuits, respectively, and when the third and fourth sampling data are different from each other, outputs a second up signal.

2. The phase detector according to claim 1, wherein the four-phase first, second, third, and fourth clocks are out of phase with one another by 90°.

3. The phase detector according to claim 1, wherein the first and third clocks are clocks for sampling a center of the data; and
   the second and fourth clocks are clocks for sampling a transition part of the data.

4. The phase detector according to claim 1, further comprising:
   first and fourth timing-adjusting circuits that output the first up signal and the first down signal such that the first up and down signals are synchronized by the second clock; and
   second and third timing-adjusting circuits that output the second up signal and the second down signal such that the second up and down signals are synchronized by the fourth clock.

* * * * *